United States Patent [19]

Matthews et al.

[11] Patent Number: 5,015,959
[45] Date of Patent: May 14, 1991

[54] SENSE WIRE SIGNAL ENHANCEMENTS FOR INSULATION DEFECT DETECTION

[75] Inventors: Gregory D. Matthews, Edgewood; Juris A. Asars, Murrysville Borough, both of Pa.

[73] Assignee: Westinghouse Electric Corp., Pittsburgh, Pa.

[21] Appl. No.: 461,577

[22] Filed: Jan. 5, 1990

[51] Int. Cl.$^5$ .................. G01N 27/20; G01R 31/08; H04B 3/46
[52] U.S. Cl. ..................................... 324/557; 324/514
[58] Field of Search ............... 324/557, 512, 513, 514, 324/527, 541, 544, 452, 456; 340/647, 651

[56] References Cited

U.S. PATENT DOCUMENTS

| | | | |
|---|---|---|---|
| 3,047,800 | 7/1962 | Eigen | 324/514 |
| 3,263,165 | 7/1966 | Eigen | 324/514 |
| 4,891,597 | 1/1990 | Asars | 324/541 |
| 4,931,684 | 5/1990 | Asars et al. | 324/541 |

Primary Examiner—Reinhard J. Eisenzopf
Assistant Examiner—Maura K. Regan
Attorney, Agent, or Firm—E. F. Possessky

[57] ABSTRACT

A device for monitoring an electrical cable comprising a conductor surrounded by insulation to locate insulation defects while a signal is impressed on the conductor, the device including an ion generator for creating an ionized atmosphere to envelop the cable, a sense wire assembly disposed in the vicinity of the cable and within the ionized atmosphere so that the signal impressed on the conductor is coupled into the sense wire assembly when the ionized atmosphere envelops an insulation defect, and a circuit for monitoring the signal coupled into the sense wire assembly from the cable conductor. The sense wire assembly comprises a first wire presenting a low resistance to the ionized atmosphere, a second wire presenting a high resistance to the ionized atmosphere, and a circuit unit for producing a sense wire signal which is a function of the difference between the signal coupled into said first and second wires. The device may further include a reference conductor for producing a correction signal representative of the degree of resistive coupling of the reference signal into the first sense wire and a correction circuit for correcting the signal produced by the monitoring circuit as a function of the value of the correction signal.

11 Claims, 1 Drawing Sheet

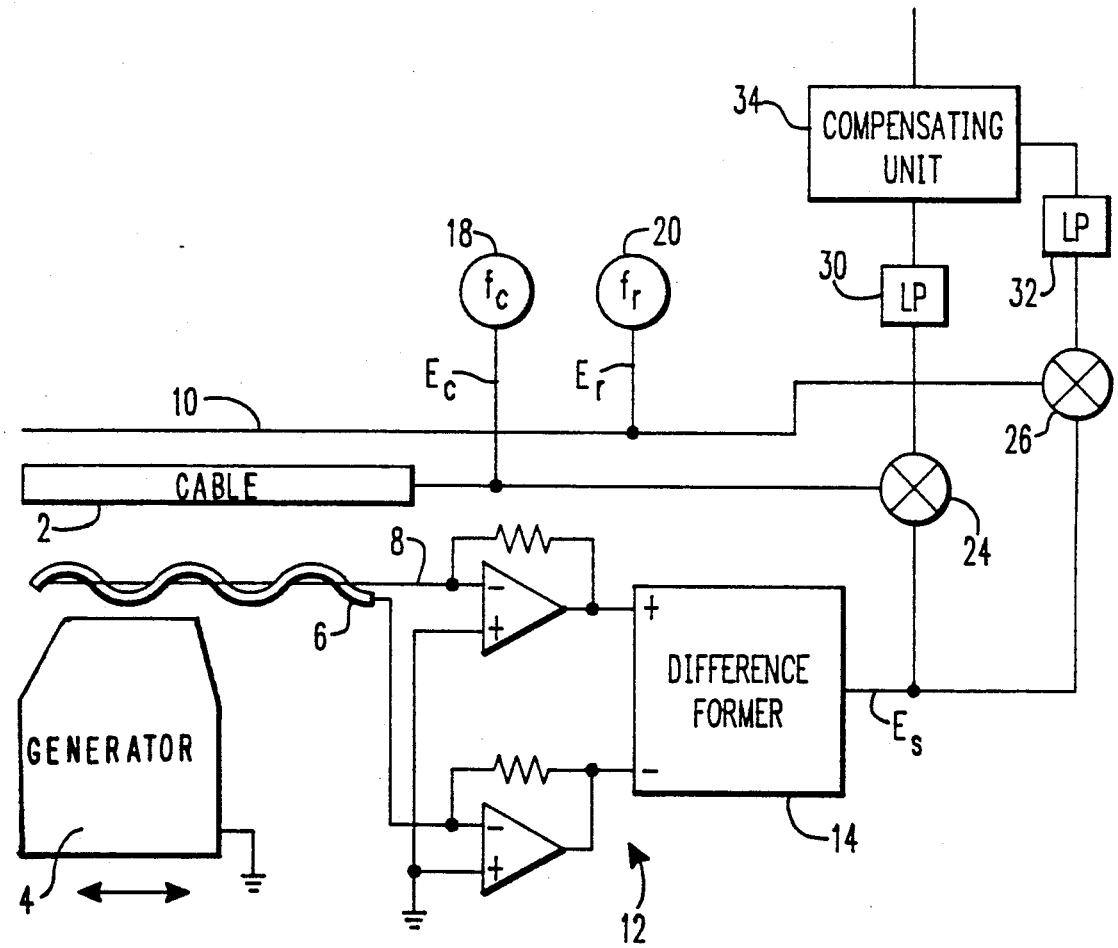

SENSE WIRE SIGNAL ENHANCEMENTS FOR INSULATION DEFECT DETECTION

FIELD OF THE INVENTION

The present invention relates to methods and devices used to detect defects in the insulation around wires and cables. More particularly it relates to an insulation defect detector which utilizes synchronous detection.

BACKGROUND OF THE INVENTION

In certain situations and circumstances, it is important to know if the insulation surrounding a wire or cable has deteriorated. Such deterioration could be a precursor to a failure in an important system. For example, in jet fighter aircraft, wire chaffing and the resulting deterioration of the insulation are often precursors to failure. If the chaffing continues undetected, the cable may be severed or shorted to another cable with catastrophic results depending on the purpose of the cable. If the cable is used to control the rudder or aileron, severing or shorting of that cable could result in a loss of control of the aircraft and possibly a fatal crash. It would be desirable therefore to be able to detect deterioration of wire insulation before failure occurs. If insulation defects and deterioration are detected in a timely manner, the wire or cable could be replaced before a catastrophic failure occurs.

U.S. Pat. No. 3,096,478 discloses an apparatus for detecting non-uniformity in electrically insulated wires through the use of conductive gas electrodes. The electrodes consist of a tube or sleeve containing ionized air which establishes a direct current path through the defective insulation segment. In the apparatus disclosed in this patent, the cable must be placed inside the conductive gas electrode. The conductor of the cable itself must be grounded and the cable must be moved through the conductive gas electrode during the test, so that the system can be employed essentially only for testing cables prior to installation. A current or voltage of fixed magnitude as applied to the, or one, electrode and a fault indication is based on a change in current flow through the cable insulation.

U.S. Pat. No. 3,263,165 describes apparatus for detecting corona-producing cable insulation defects. For this purpose, a voltage gradient is established along the cable by electrodes containing an ionized gas, the voltage being sufficient to cause gaseous areas in the cable insulation to become ionized and produce high frequency radiation which is detected. The cable is advanced through the apparatus and does not itself conduct any signal. Here again, the cable must be tested prior to installation.

The systems disclosed in both of these references require the measurement of very small currents in the cable under test and require that the cable not be in an installed state. These requirements considerably limit the range of applications of such systems.

U.S. Pat. No. 3,639,831 discloses a method and apparatus for producing a directable, electrically conducting gas jet and detecting the presence of anomalies therein caused by insulators, conductors or semiconductors. The gas jet flows across a test zone and impinges upon a target anode which is maintained at a bias potential with respect to the cathode of the ionizing generator such as to cause an electrical current to flow between the anode and the cathode via the gas jet across the test zone. This device requires that the electrical current flow between the gas jet nozzle and the target anode be constant. Moreover, there is no provision for measuring anomalies which have their own potential or are carrying a current.

Allowed U.S. application Ser. No. 07/267,138, filed on Nov. 4, 1988, discloses devices for detecting cable insulation defects which utilize an ionized gas stream or cloud in a manner which differs fundamentally from the techniques described in the above-cited patents. These devices can be used to test installed cables which are connected in an electrical system and are carrying their normal signals.

The devices disclosed in application Ser. No. 07/267,138 include an ion source and at least one sense conductor, both disposed adjacent the cable to be tested while the latter is carrying a normal alternating voltage. According to one embodiment, an ion source is moved along the cable under test to produce a localized ion cloud forming a conductive region between the cable and a single sense conductor. When a cable insulation defect of sufficient severity is encountered by the ion cloud, the electric field produced by the signal on the cable conductor induces a corresponding signal on the sense conductor. This occurrence can be detected by performing synchronous detection of the sense wire signal with respect to the cable conductor signal. The location of an insulation defect can be determined by noting the position of the ion source at the moment when a synchronous detection output signal is being produced.

In a copending application filed concurrently with the present application, entitled DEFECT POSITION LOCATOR FOR CABLE INSULATION MONITORING, and bearing Westinghouse Case No. 55,431, there is disclosed a device which operates according to the principles disclosed in the above-cited pending application and which employs coded position conductors to which respective signals are applied. These signals will be coupled into the sense wire and then synchronously detected together with the sense wire current signal to provide an indication of the instantaneous location of the ion cloud along the length of the position conductors.

In the operation of devices employing a bare sense wire, the sense wire acts as a capacitive pick-up probe in which currents will develop in response to surrounding electromagnetic fields, including those produced by extraneous electrical systems such as power lines, even in the absence of an ion cloud. The presence of an ion cloud increases this coupling. In addition, in the presence of an insulation defect, or a bare wire carrying a signal, at a location enveloped by an ion cloud, the sense wire is resistively coupled to these signals, resulting in the production of current components in the sense wire which are in phase with the signals on the cable conductor or other bare conductors. However, these in-phase currents, which it is desired to sense, are quite small in comparison to large capacitively coupled currents, such as those produced by nearby power lines. Because of the low level of these in-phase currents, which are the currents to be detected, it may be difficult to separate them from the other current components generated in the sense wire.

Moreover, in devices of the type here under consideration, variations can occur in the distance between the sense wire and the cable conductor under test, as would occur particularly when use is made of a portable ion source carrying the sense wire. When this occurs, the currents induced in the sense wire will vary as a function of such distance variations. In addition, the currents induced in the sense wire will vary as a function of the strength of the ion cloud. These variations can be sufficiently large to effectively mask out the current variations resulting from cable insulation defects.

SUMMARY OF THE INVENTION

It is an object of the present invention to eliminate, or at least substantially reduce, the masking effects of extraneous fields on the sense wire current to be detected.

Another object of the invention is to eliminate, or at least substantially reduce, variations in the current component to be detected resulting from variations in the distance between the sense wire and the conductor under test and variations in the strength of the ion cloud which provides the resistive coupling path between the conductor under test and the sense wire.

A more specific object of the invention is to produce a sense wire signal in which components due to capacitive coupling are substantially suppressed.

Another specific object of the invention is to produce a signal which is representative of the current generated in a sense wire by resistive coupling with a conductor under test and to modify that signal in accordance with variations in the distance between the sense wire and the conductor under test and variations in the strength of the ion cloud therebetween.

The above and other objects are achieved, according to the present invention, by a device for monitoring an electrical cable composed of a conductor surrounded by insulation, to locate insulation defects, while a signal is impressed on the conductor, in the presence of noise fields, comprising:

an ion generator for creating an ionized atmosphere to envelop the cable;
sense wire means arranged to be disposed in the vicinity of the cable and within the ionized atmosphere so that the signal impressed on the cable conductor is coupled into the sense wire means when the ionized atmosphere envelops an insulation defect; and
means for monitoring the signal coupled into the sense wire means from the cable conductor,
wherein the sense wire means comprise a first wire presenting a low resistance to the ionized atmosphere, a second wire presenting a high resistance to the ionized atmosphere, and means connected for producing a sense wire signal which is a function of the difference between the signal coupled into the first wire and the signal coupled into the second wire.

The objects according to the invention are further achieved by a device for monitoring an electrical cable composed of a conductor surrounded by insulation, to locate insulation defects, while a signal is impressed on the conductor, in the presence of noise fields, comprising:

an ion generator for creating an ionized atmosphere to envelop the cable;
sense wire means arranged to be disposed in the vicinity of the cable and within the ionized atmosphere so that the signal impressed on the cable conductor is coupled into the sense wire means when the ionized atmosphere envelops an insulation defect;
means for monitoring the signal coupled into the sense wire means from the cable conductor,
a reference conductor arranged to extend along, and in a fixed position relative to, the cable and within the ionized atmosphere;
signal generator means connected for applying an alternating reference signal to the reference conductor; and
signal detector means connected for producing a correction signal representative of the degree of resistive coupling of the reference signal into the sense wire means.

BRIEF DESCRIPTION OF THE DRAWING

The FIGURE is a partly pictorial, partly schematic diagram illustrating one form of insulation defect detection device incorporating a sense wire pair and a reference wire according to the present invention.

DESCRIPTION OF THE PREFERRED EMBODIMENTS

The defect detection device illustrated in the FIGURE is arranged to produce indications of defects present in the insulation of a cable 2. For this purpose, the detection device is provided with an ion generator 4 of a known type, which may be a portable device arranged to be displaced, for example manually, along the length of cable 2 to be tested. Associated with ion generator 4 is a twisted sense wire pair composed of an insulated wire 6 and a bare wire 8. The sense wire pair may be carried by generator 4 and the length of the region over which the sense wire pair extends need not be coextensive with the length of cable 2, but need only be coextensive with the region of the ion cloud produced by generator 4.

In further accordance with the invention, there is provided a reference wire 10, which is preferably mounted to be parallel to, and to have a fixed position relative to, cable 2, reference wire 10 extending along the entirety of the length of cable 2 which is to be tested.

Wires 6 and 8 are connected via current/voltage converters 12 to a difference forming circuit 14 which receives, from converters 12, voltage signals proportional to the currents induced in wires 6 and 8 and produces an output signal, Es, equal to the difference between the currents induced in wires 6 and 8. As shown, each converter 12 can be a conventional device composed of an operational amplifier provided with a resistive feedback connection.

As shown, source 4 and each sense wire are connected so that source 4, the ion cloud which it produces and each sense wire form a respective current loop.

In many situations where a cable is to be tested while in its installed state, the region in which the cable is disposed will frequently be in the vicinity of other electromagnetic field sources, possibly including power lines. In cable insulation defect detection devices of the type here contemplated, i.e., devices which generate an ion cloud and employ a sense wire, signals will be coupled into the sense wire both capacitively and conductively and the capacitive coupling with extraneous field sources will be enhanced by the ion cloud or stream. On the other hand, the presence of an insulation defect in a region enveloped by the ion cloud will result in resistive, i.e., in phase, coupling between the conductor of the cable under test and the sense wire. These currents tend to be quite small in comparison to the various capacitively coupled currents. In the device shown in the FIGURE, resistive coupling will occur between the signal on reference wire 10 and a bare sense wire.

The sense wire pair according to the present invention can serve to perform a substantial cancelling of the effect of the capacitively coupled currents, thereby yielding an improved signal-to-noise ratio with respect to the resistively coupled currents representative of insulation defects and representative of a signal on reference wire 10.

To this end, the sense wire pair is composed of a first wire 8 having a low resistance to ion current flow, preferably a bare wire, and a second wire 6 which behaves as a good insulator with respect to resistive current flow, i.e., an insulated wire.

These wires will have capacitive coupling properties which differ from one another by only a small amount, but a substantial difference with respect to their resistive coupling with surrounding fields. Therefore, a signal representative of the difference between the currents induced in the two sense wires will be more accurately representative of the current induced in the bare sense wire by resistive coupling.

Because of the small differential between the capacitive coupling properties of wires 6 and 8, the difference between the currents induced in wires 6 and 8 will have a small component having an amplitude corresponding to the capacitive coupling differential between wires 6 and 8 and shifted in phase from the signal resulting from resistive coupling. This small component can be cancelled by adjusting the gain of one of converters 12 and by introducing a phase shifting device in series with one of converters 12, preferably the converter 12 connected to wire 6.

To provide signals which can be coupled into the sense wires, a first signal generator 18 is connected to impress an alternating current signal Ec at a selected frequency $f_c$ on the conductor of cable 2, while a second signal generator 20 is connected to impress a reference signal $E_r$ at a selected frequency $f_r$ on reference wire 10. The frequency $f_r$ is selected to be different from $f_c$.

The signal $E_c$ is further applied to a first input of a first synchronous detector 24, while the signal $E_r$ is applied to a first input of a second synchronous detector 26, each synchronous detector additionally being connected to receive, at a second input, the signal Es produced by difference former 14.

The output of each synchronous detector 24, 26 is connected to a respective lowpass filter 30, 32.

Each synchronous detector-lowpass filter combination essentially constitutes a multiplier producing a unidirectional output representative of the product of the absolute magnitude values of the signals applied thereto and the cosine of the phase angle between those signals. Thus, the magnitude of the output from lowpass filter 30 will be a function of the degree of resistive, or in phase, coupling between the conductor of cable 2 and sense wire 8, as well as the phase angle between Ec and Es.

To a first approximation, the peak amplitude of $E_s$ as a function of the peak amplitude of Ec will vary in dependence on variations in the spacing between cable 2 and wires 6 and 8 and on variations in the intensity of the ion cloud which establishes a conductive path between cable 2 and wires 6 and 8. The value of the phase angle between Ec and Es will be essentially a function of the condition of the insulation of cable 2 in the region which is enveloped by the ion cloud. Therefore, if effects other than that caused by the condition of the insulation of cable 2 can be cancelled, then the resulting indication will constitute a more accurate representation of the condition of the cable insulation.

To achieve this result, reference wire 10 is disposed in a fixed position relative to, and parallel to, cable 2, and reference wire 10 is constituted by a bare wire or a wire having a very low insulation resistance, so that the signal coupling between reference wire 10 and sense wires 6 and 8 will vary essentially only as a function of: variations in the distance between sense wires 6 and 8, on the one hand, and cable 2, on the other hand, and; variations in the intensity of the ion cloud. Thus, when synchronous detection of signal Er is effected relative to Es, in synchronous detector 26 and lowpass filter 32, the resulting output signal can be used to compensate the output signal from filter 30, this being done, in the illustrated circuit, in a compensating unit 34 which can be constructed according to known techniques to modify the output signal from filter 30 on the basis of the signal at the output of filter 32 in a manner to achieve an appropriate degree of compensation.

To cite one example of such compensation, unit 34 could be constituted by an amplifier having a digitally controllable gain and a digital function generator connected to convert the output of filter 32 into digital form and to derive from the converted signal an amplifier control value. According to one conventional technique for deriving such a control value, preliminary testing is performed to determine the relation between the output signal from filter 32 and the corresponding amount by which the amplification factor of unit 34 should be varied to compensate for the resulting error in the output signal from filter 30. These values can then be stored in a memory, for example in the form of a table, having a plurality of locations, with the address of each location corresponding to the digital version of a respective value of the output signal from filter 32 and the content of each memory location corresponding to the associated amplification control signal which must be supplied to the amplifier of unit 34. Thus, by addressing the memory on the basis of the output signal from filter 32, the appropriate amplification control signal is read out of the memory. With such an arrangement, an accurate approximation of the relationship determined to exist between the output signal from filter 32 and the error in the output signal from filter 30 can be established.

The improvements contemplated by the present invention could be incorporated in a device employing coded position conductors, as disclosed in the previously cited concurrently filed application bearing Westinghouse Case No. 55,431. In addition, embodiments of the invention can employ an extended ion source producing a localized ion cloud or stream which travels along the length of the source.

What is claimed:

1. A device for monitoring an electrical cable composed of a conductor surrounded by insulation, to locate insulation defects, while a signal is impressed on the conductor, in the presence of noise fields, comprising:

an ion generator for creating an ionized atmosphere to envelop the cable;

sense wire means arranged to be disposed in the vicinity of the cable and within the ionized atmosphere so that the signal impressed on the cable conductor is coupled into said sense wire means when the ionized atmosphere envelops an insulation defect; and means for monitoring the signal coupled into said sense wire means from the cable conductor, wherein said sense wire means comprise a first wire presenting a low resistance to the ionized atmosphere, a second wire presenting a high resistance to the ionized atmosphere, and means connected for producing a sense wire signal which is a function of the difference between the signal coupled into said first wire and the signal coupled into said second wire.

2. A device as defined in claim 1 wherein each said wire is connected to conduct a current, and said means for producing a sense wire signal comprise signal converter means for producing signals representative of the current conducted by each said wire, and difference former means connected to said converter means for producing a signal constituting said sense wire signal and proportional to the difference between the current being conducted by said first wire and the current being conducted by said second wire.

3. A device as defined in claim 2 wherein said first wire is a bare wire and said second wire is an insulated wire.

4. A device as defined in claim 3 wherein said first and second wires are twisted together.

5. A device as defined in claim 1 wherein said means for monitoring comprise:

signal detector means connected for producing an output signal representative of the degree of resistive coupling of the signal impressed on the cable conductor into said first sense wire.

6. A device as defined in claim 5 further comprising: a reference conductor arranged to extend along, and in a fixed position relative to, the cable; signal generator means connected for applying an alternating reference signal to said reference conductor; second signal detector means connected for producing a correction signal representative of the degree of resistive coupling of the reference signal into said first sense wire; and correction means connected for correcting said output signal as a function of the value of said correction signal.

7. A device as defined in claim 6 wherein each said signal detector means comprises a synchronous detector.

8. A device as defined in claim 1 wherein said ion generator is operative to produce a localized ionized atmosphere which is displaceable along the cable.

9. A device for monitoring an electrical cable composed of a conductor surrounded by insulation, to locate insulation defects, while a signal is impressed on the conductor, in the presence of noise fields, comprising:

an ion generator for creating an ionized atmosphere to envelop the cable;

sense wire means arranged to be disposed in the vicinity of the cable and within the ionized atmosphere so that the signal impressed on the cable conductor is coupled into said sense wire means when the ionized atmosphere envelops an insulation defect;

means for monitoring the signal coupled into said sense wire means from the cable conductor, a reference conductor arranged to extend along, and in a fixed position relative to, the cable and within the ionized atmosphere;

signal generator means connected for applying an alternating reference signal to said reference conductor; and signal detector means connected for producing a correction signal representative of the degree of resistive coupling of the reference signal into said sense wire means.

10. A device as defined in claim 9 wherein the frequency of the reference signal is different from the frequency of the signal impressed on the cable conductor.

11. A device as defined in claim 10 wherein said signal detector means comprise a synchronous detector connected to receive a signal produced by said signal generator means and a signal corresponding to the signal coupled into said sense wire means.

* * * * *